United States Patent
Ogawa

(10) Patent No.: US 7,915,687 B2
(45) Date of Patent: Mar. 29, 2011

(54) SEMICONDUCTOR DEVICE AND METHOD FOR FABRICATING THE SAME

(75) Inventor: Hisashi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/327,271

(22) Filed: Dec. 3, 2008

(65) Prior Publication Data

US 2009/0146215 A1    Jun. 11, 2009

(30) Foreign Application Priority Data

Dec. 7, 2007  (JP) .................................. 2007-316672

(51) Int. Cl.
*H01L 29/76*   (2006.01)
*H01L 29/94*   (2006.01)
*H01L 31/062*  (2006.01)
*H01L 31/113*  (2006.01)
*H01L 31/119*  (2006.01)

(52) U.S. Cl. .................. 257/369; 257/392; 257/E27.06; 257/E27.062

(58) Field of Classification Search .................. 257/337, 257/338, 368, 369, 388, 392, E27.062, E27.06

See application file for complete search history.

(56) References Cited

U.S. PATENT DOCUMENTS

| 7,030,024 | B2 | 4/2006 | Ho et al. | |
| 2005/0098839 | A1 | 5/2005 | Lee et al. | |
| 2005/0253181 | A1 | 11/2005 | Kimizuka et al. | |
| 2007/0178634 | A1 | 8/2007 | Jung et al. | |
| 2009/0114996 | A1* | 5/2009 | Inumiya et al. | 257/369 |
| 2010/0059833 | A1* | 3/2010 | Yu et al. | 257/410 |

OTHER PUBLICATIONS

Song, S.C. et al., "Highly Manufacturable 45nm LSTP CMOSFETs Using Novel Dual High-k and Dual Metal Gate CMOS Integration," VLSI, 2006, pp. 16-17.

* cited by examiner

*Primary Examiner* — Hoai v Pham
(74) *Attorney, Agent, or Firm* — McDermott Will & Emery LLP

(57) ABSTRACT

A semiconductor device includes: a first gate insulating film on a first region of a semiconductor substrate; a first gate electrode on the first gate insulating film; a second gate insulating film on a second region of the semiconductor substrate; and a second gate electrode on the second gate insulating film. The first gate insulating film includes a first insulating film composed of a first material containing a first metal, and the second gate insulating film includes a second insulating film composed of the first material and a second material containing a second metal.

45 Claims, 4 Drawing Sheets

SEMICONDUCTOR DEVICE AND METHOD FOR FABRICATING THE SAME

CROSS-REFERENCE TO RELATED APPLICATION

The disclosure of Japanese Patent Application No. 2007-316672 filed in Japan on Dec. 7, 2007 including specification, drawings, and claims is incorporated herein by reference in its entirety.

BACKGROUND OF THE INVENTION

The present disclosure relates to a semiconductor device and a method for fabricating the same and specifically, to a semiconductor device including a gate electrode having a gate insulating film made of a high dielectric constant film and a metal film and to a method for fabricating the same.

A complementary metal-oxide semiconductor (CMOS) device is required to be further miniaturized. For miniaturization, it is necessary to reduce the thickness of a gate insulating film. However, when the thickness of a conventional, silicon oxide film-based gate insulating film is further reduced, a leak current increases, increasing a stand-by current of a large scale integration (LSI) circuit. Thus, the silicon oxide film-based gate insulating film has reached the limit of reducing the film thickness. Therefore, attention has been focused on a complementary metal-insulator semiconductor (CMIS) device in which instead of the silicon oxide film, an insulating film made of high dielectrics or the like is used as a gate insulating film. Since the electrical thickness of a high dielectric constant film can be reduced even when the physical thickness of the high dielectric constant film is increased, it is expected that the high dielectric constant film allows the thickness of the gate insulating film to be further reduced. Currently, hafnium silicate nitride (HfSiON) is regarded as the most promising high dielectric constant film for the gate insulating film.

Moreover, as to a gate electrode, depletion of a polysilicon electrode is no longer negligible. Therefore, a metal gate electrode without the depletion has been enthusiastically developed.

Meanwhile, in an n-type metal-insulator semiconductor field-effect transistor (MISFET) and a p-type MISFET, characteristics required for gate insulating films and gate electrodes are different. It is preferable that the n-type MISFET has a reduced work function and the p-type MISFET has an increased work function.

Therefore, the process of forming an n-type MISFET and a p-type MISFET having different gate insulating films and gate electrodes from each other has been proposed (for example, see S. C. Song et al., "Highly Manufacturable 45 nm LSTP CMOSFETs Using Novel Dual High-k and Dual Metal Gate CMOS Integration", VLSI, 2006, pp. 16-17).

In a method for fabricating the conventional semiconductor device, first, over a semiconductor substrate having a p-type region and an n-type region which are separate from each other by a device isolation region, a first insulating film and a first conductive film are sequentially formed. Subsequently, portions of the first insulating film and the first conductive film formed over the n-type region are selectively removed. Next, over the entire surface of the semiconductor substrate, a second insulating film and a second conductive film are sequentially formed. Subsequently, portions of the second insulating film and the second conductive film formed over the p-type region are selectively removed. Next, over the entire surface of the semiconductor substrate, a polysilicon film is formed. Then, the polysilicon film, the first conductive film, the second conductive film, the first insulating film, and the second insulating film are selectively removed. In this way, in the p-type region, a first gate electrode including the polysilicon film and the first conductive film and a first gate insulating film including the first insulating film are formed, and in the n-type region, a second gate electrode including the polysilicon film and the second conductive film and a second gate insulating film including the second insulating film are formed.

Making the first insulating film of HfSiON, the first conductive film of TiN, the second insulating film of $HfO_2$, and the second conductive film of TaN can optimize the characteristics of the p-type MISFET and the n-type MISFET.

SUMMARY OF THE INVENTION

However, inventors of the present application found that the above-mentioned method for fabricating the conventional semiconductor device has problems as follows. The method for fabricating the conventional semiconductor device includes the steps of selectively removing the first insulating film and the first conductive film, and selectively removing the second insulating film and the second conductive film. The etching rates of HfSiON serving as the first insulating film and $HfO_2$ serving as the second insulating film are smaller than that of Non-doped Silicate Glass (NSG) serving as the device isolation region.

Therefore, as shown in FIG. 4A, at the time when a first insulating film 112 and a first conductive film 113 are formed over a p-type region 110A of a semiconductor substrate 110 and a second insulating film 115 and a second conductive film 116 are formed over an n-type region 110B of the semiconductor substrate 110, undercuts 111a are formed in a device isolation region 111.

In this state, as shown in FIG. 4B, deposition of a polysilicon film 119 is performed, so that the polysilicon film 119 filling the undercuts 111a is formed.

Then, as shown in FIG. 4C, the polysilicon film 119, the first conductive film 113, the second conductive film 116, the first insulating film 112, and the second insulating film 115 are patterned by etching. In this way, over the p-type region 110A, a first gate electrode including the polysilicon film 119 and the first conductive film 113 and a first gate insulating film including the first insulating film 112 are formed. Moreover, over the n-type region 110B, a second gate electrode including the polysilicon film 119 and the second conductive film 116 and a second gate insulating film including the second insulating film 115 are formed.

Here, in portions of the device isolation region 111 where the undercuts 111a are formed, residues 119a of the polysilicon film remain. The residues 119a of the polysilicon film remaining in the device isolation region 111 cause a short circuit or the like of a gate interconnect in subsequent steps, which is to be a cause of a defect in the semiconductor device.

The present invention provides a semiconductor device which includes a p-type MISFET and an n-type MISFET each having an optimal gate insulating film and an optimal gate electrode and in which no polysilicon film residue causing a defect is formed.

Specifically, a semiconductor device of the present invention includes a first MISFET having a first gate insulating film containing a first metal and a second MISFET having a second gate insulating film containing the first metal and a second metal.

More specifically, the semiconductor device according to the present invention includes: a first gate insulating film formed on a first region of a semiconductor substrate; a first gate electrode formed on the first gate insulating film; a second gate insulating film formed on a second region of the semiconductor substrate; and a second gate electrode formed on the second gate insulating film. The first gate insulating film includes a first insulating film composed of a first material containing a first metal, and the second gate insulating film includes a second insulating film composed of the first material and a second material containing a second metal.

According to the semiconductor device of the present invention, it is possible to form the second gate insulating film different in composition from the first gate insulating film without removing the first gate insulating film formed on the second region. Therefore, there is no possibility that the undercuts are formed in the device isolation region. Therefore, no defect caused by the polysilicon residues occurs, and it is possible to easily form a p-type MISFET and an n-type MISFET each having an optimal gate insulating film.

A method for fabricating a semiconductor device of the present invention includes the steps of: (a) sequentially forming a first material film and a first conductive film over the entire surface of a semiconductor substrate, the first material film being insulative and containing a first metal, and the semiconductor substrate including a first region and a second region separate from each other by a device isolation region; (b) leaving the first material film and removing a portion of the first conductive film formed over the second region; (c) after step (b), sequentially forming a second material film containing a second metal and a second conductive film over the entire surface of the semiconductor substrate; (d) after step (c), removing portions of the second conductive film and the second material film formed over the first region; (e) after step (d), forming a polysilicon film over the entire surface of the semiconductor substrate; and (f) selectively removing the polysilicon film, the first conductive film, the first material film, the second conductive film, and the second material film to form a first gate electrode including the polysilicon film and the first conductive film and a first gate insulating film including the first material film over the first region and to form a second gate electrode including the polysilicon film and the second conductive film and a second gate electrode including the second material film and the first material film over the second region.

The method for fabricating a semiconductor device of the present invention includes the step of leaving the first material film and removing the portion of the first conductive film formed over the second region. Therefore, the device isolation region is covered with the first material film, and thus the device isolation region is not etched and no undercut is formed during the formation of gate electrodes and gate insulating films. Therefore, it becomes possible to easily form a p-type MISFET and an n-type MISFET each having an optimal gate insulating film.

DETAILED DESCRIPTION

Embodiment

Figure 1:
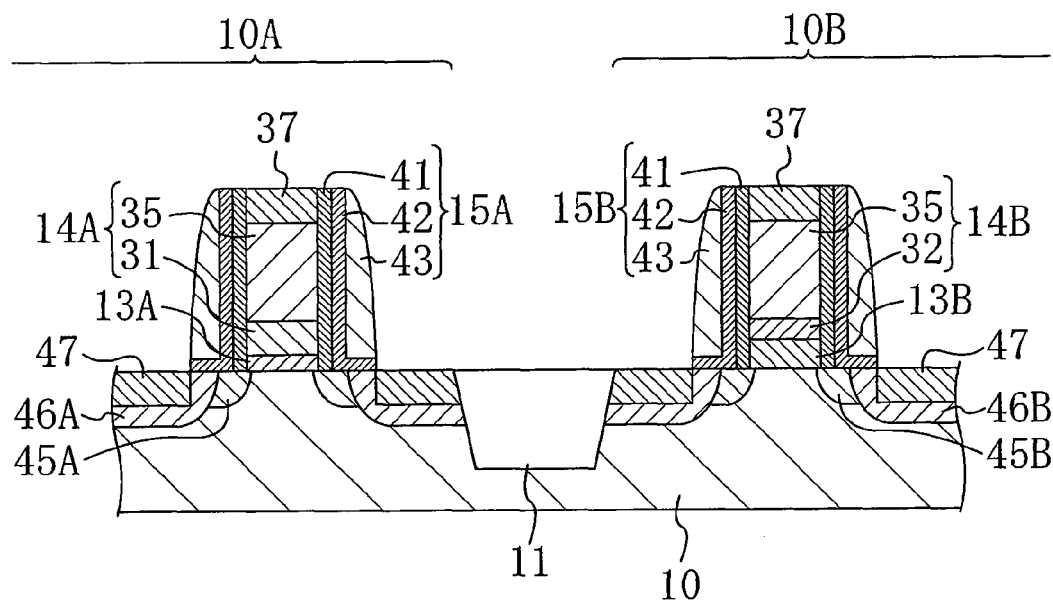
FIG. 1 is a cross-sectional view showing a semiconductor device according to an embodiment of the present invention.

An embodiment of the present invention will be described with reference to the drawings. FIG. 1 shows a cross-sectional configuration of an example semiconductor device. As shown in FIG. 1, a semiconductor substrate 10 includes a first region 10A which is to be an active region of a p-type MISFET and a second region 10B which is to be an active region of an n-type MISFET. The first region 10A and the second region 10B are separate from each other by a device isolation region 11.

In the first region 10A, a first FET serving as the p-type MISFET is formed. The first FET includes a first gate insulating film 13A and a first gate electrode 14A sequentially formed over the first region 10A from bottom to top. The first gate insulating film 13A includes an interface layer (not shown) made of SiON and a first insulating film made of hafnium silicate nitride (HfSiON) sequentially formed from bottom to top. The first gate electrode 14A includes a first conductive film 31 made of titanium nitride (TiN) having a thickness of 15 nm and a polysilicon film 35 having a thickness of 100 nm sequentially formed from bottom to top. In an upper portion of the polysilicon film 35, a silicide layer 37 is formed.

On both side faces of the first gate electrode 14A, first sidewalls 15A are formed. Each first sidewall 15A includes an offset spacer 41 formed on the side face of the first gate electrode 14A, an L-shaped inner sidewall 42 formed over the side face of the first gate electrode 14A with the offset spacer 41 provided therebetween, and an outer sidewall 43 formed on the inner sidewall 42.

In first region 10A, p-type first extension regions 45A are formed outside the first gate electrode 14A, and outside the first extension regions 45A, p-type first source/drain regions 46A are formed in a self aligning manner with respect to the first sidewalls 15A. The first source/drain regions 46A are greater in junction depth than the first extension regions 45A. In upper portions of the first source/drain regions 46A, a silicide layer 47 is formed.

In the second region 10B, a second FET serving as the n-type MISFET is formed. The second FET includes a second gate insulating film 13B and a second gate electrode 14B sequentially formed over the second region 10B from bottom to top. The second gate insulating film 13B includes an interface layer (not shown) made of SiON and a second insulating film sequentially formed from bottom to top. The second insulating film is a mixed film of HfSiON and lanthanum oxide ($La_2O_3$). The second gate electrode 14B includes a second conductive film 32 made of tantalum nitride (TaN) having a thickness of 5 nm and the polysilicon film 35 having a thickness of 100 nm sequentially formed from bottom to top. In an upper portion of the polysilicon film 35, the silicide layer 37 is formed.

On both side faces of the second gate electrode 14B, second sidewalls 15B are formed. Each second sidewall 15B includes the offset spacer 41 formed on the side face of the second gate electrode 14B, the L-shaped inner sidewall 42 formed over the side face of the second gate electrode 14B with the offset spacer 41 provided therebetween, and the outer sidewall 43 formed on the inner sidewall 42.

In the second region 10B, n-type second extension regions 45B are formed outside the second gate electrode 14B, and outside the second extension regions 45B, n-type second source/drain regions 46B are formed in a self aligning manner with respect to the second sidewalls 15B. The second source/drain regions 46B are greater in junction depth than the second extension regions 45B. In upper portions of the second source/drain regions 46B, the silicide layer 47 is formed.

The semiconductor device of the present embodiment is a complementary metal-insulator semiconductor (CMIS) FET including a p-type MISFET and an n-type MISFET each having an optimal gate insulating film and an optimal gate electrode. Specifically, the first gate electrode 14A is made of TiN and polysilicon, and the second gate electrode 14B is made of TaN and polysilicon. Therefore, it is possible to increase the effective work function of the first gate electrode of the p-type MISFET and to reduce the effective work function of the second gate electrode of the n-type MISFET.

Moreover, the first gate insulating film 13A of the p-type MISFET is made of HfSiON serving as a first material, and a second gate insulating film 13B of the n-type MISFET is made of a mixed film which is obtained by adding $La_2O_3$ serving as a second material to HfSiON serving as the first material. Therefore, it is possible to further reduce the effective work function of the second gate electrode 14B, and to realize an n-type MISFET having a lower threshold voltage. Moreover, forming the second gate insulating film 13B by the mixed film of HfSiON and $La_2O_3$ eliminates a possibility of formation of the residues of the polysilicon film, which was a problem in the conventional semiconductor device, and provides the effect of allowing fabrication of a semiconductor device with good yield as described below.

A method for fabricating a semiconductor device according to an embodiment of the present invention will be described below. FIGS. 2A to 2D and FIGS. 3A to 3C illustrate steps in the method for fabricating a semiconductor device according to an embodiment of the present invention in the order of fabrication.

Figure 2A:
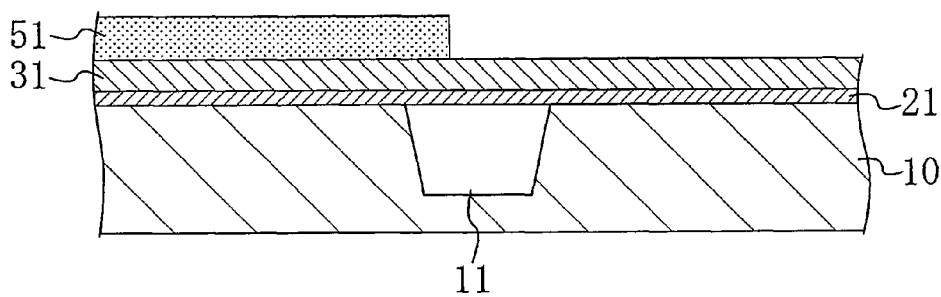
FIGS. 2A to 2D are cross sections illustrating steps in a method for fabricating a semiconductor device according to an embodiment of the present invention in the order of fabrication.

First, as illustrated with FIG. 2A, in a semiconductor substrate 10, a device isolation region 11 is formed to isolate a first region 10A and a second region 10B. Subsequently, on each of the first region 10A and the second region 10B, well formation and ion implantation for a channel stop, channel doping, and the like are performed. Then, over the entire surface of the semiconductor substrate 10, an interface layer (not shown) made of SiON having a thickness of 1.6 nm and a first material film 21 made of HfSiON having a thickness of 2.0 nm are sequentially formed. Subsequently, on the first material film 21, a first conductive film 31 made of TiN having a thickness of 15 nm is formed. The first conductive film 31 may be formed by physical vapor deposition (PVD). Then, on the first conductive film 31, a first protection film 51 made of an amorphous silicon film having a thickness of 15 nm is formed. In this case, the first protection film 51 is formed to cover a portion of the first conductive film 31 formed over the first region 10, and to expose a portion of the first conductive film 31 formed at least over the second region 10B.

Figure 2B:
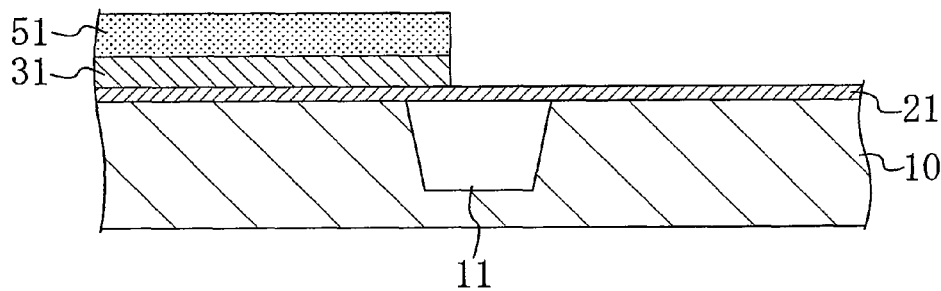

Next, as illustrated with FIG. 2B, the portion of the first conductive film 31 formed over the second region 10B is removed using the first protection film 51 as a mask.

Figure 2C:
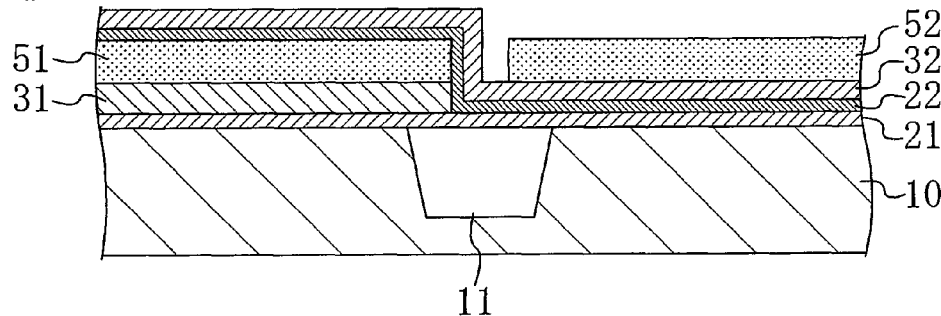

Next, as illustrated with FIG. 2C, over the entire surface of the semiconductor substrate 10, a second material film 22 made of $La_2O_3$ having a thickness of 0.5 nm and a second conductive film 32 made of TaN having a thickness of 5 nm are formed. The second material film 22 may be formed by chemical vapor deposition (CVD). The second conductive film 32 may be formed by physical vapor deposition (PVD). Subsequently, over the second region 10B, a second protection film 52 made of an amorphous silicon film having a thickness of 15 nm is formed.

Specifically, for example, over the entire surface of the semiconductor substrate 10, an amorphous silicon film having a thickness of 15 nm is formed, and then a resist covering the second region 10B is formed. After that, the amorphous silicon film over the first region 10A is etched using the resist as a mask to selectively form the second protection film 52 made of the amorphous silicon film over the second region 10B. Alternatively, over the entire surface of the semiconductor substrate 10, an amorphous silicon film having a thickness of, for example, 30 nm is formed, and then, CMP is performed to grind and remove the amorphous silicon film over the first region 10A for selectively forming the second protection film 52 made of the amorphous silicon film over the second region 10B.

Figure 2D:
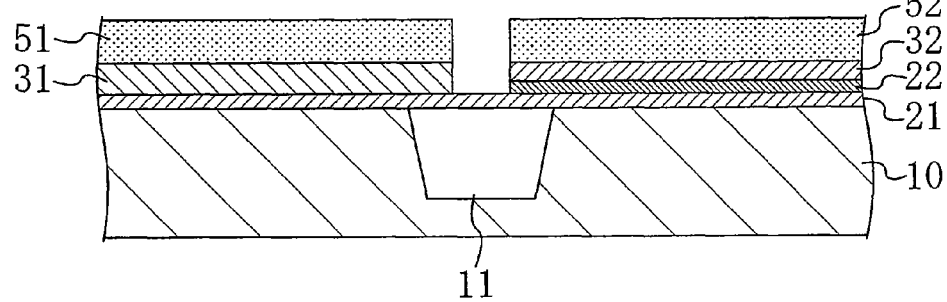

Next, as illustrated with FIG. 2D, portions of the second material film 22 and the second conductive film 32 formed over the first region 10A are removed using the second protection film 52 as a mask. The second conductive film 32 made of TaN may be removed by wet etching using a chemical solution whose main component is sulfuric acid ($H_2SO_4$). The second material film 22 made of $La_2O_3$ may be removed by wet etching using a chemical solution whose main component is hydrochloric acid (HCl). Since etch rates of HfSiON and $La_2O_3$ are greatly different and thus the etching selection ratio is great, it is easily possible to selectively remove only the second material film 22 and leave the first material film 21 on the device isolation region 11.

Figure 3A:
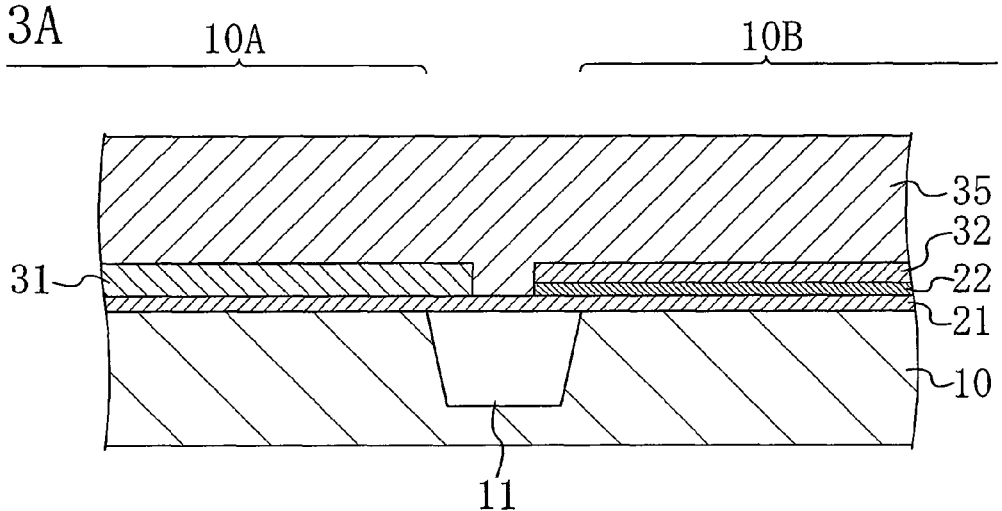
FIGS. 3A to 3C are cross-sectional views illustrating steps in the method for fabricating the semiconductor device according to the embodiment of the present invention in the order of fabrication.

Next, as illustrated with FIG. 3A, the first protection film 51 and the second protection film 52 are removed, and then over the entire surface of the semiconductor substrate 10, a polysilicon film 35 doped with phosphorus and having a thickness of 100 nm is formed. It is to be noted that, in the case where the first protection film 51 and the second protection film 52 are silicon films such as amorphous silicon films, polysilicon films, or the like, a polysilicon film 35 having a thickness of, for example, 85 nm may be formed with the first protection film 51 and the second protection film 52 being left, and the first protection film 51 and the second protection film 52 may be used as portions of gate electrodes.

Figure 3B:
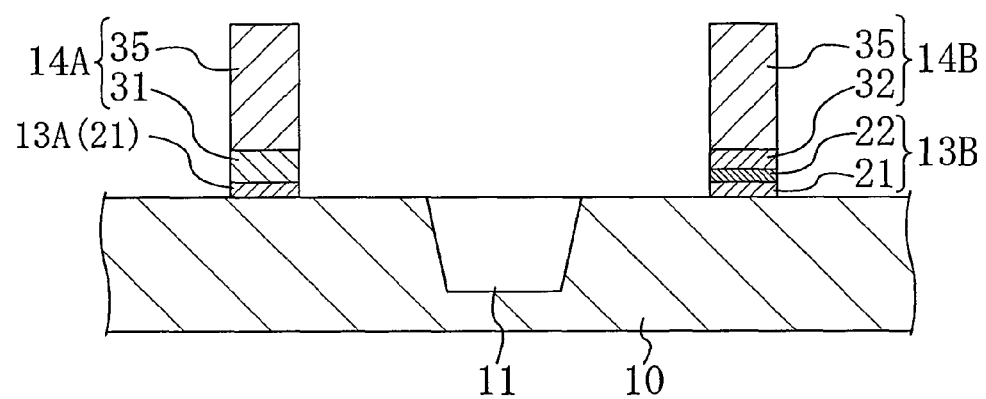

Next, as illustrated with FIG. 3B, the polysilicon film 35, the first conductive film 31, the first material film 21, the second conductive film 32, and the second material film 22 are patterned by etching using a resist mask (not shown). In this way, over the first region 10A, a first gate electrode 14A including the polysilicon film 35 and the first conductive film 31 and a first gate insulating film 13A including the first material film 21 are formed. Moreover, over the second region 10B, a second gate electrode 14B including the polysilicon film 35 and the second conductive film 32 and a second gate insulating film 13B including the second material film 22 and the first material film 21 are formed. Here, in the case where an interface layer is formed under the first material film 21, the interface layer is simultaneously patterned by the etching to be a portion of each of the first gate insulating film 13A and the second gate insulating film 13B.

Figure 3C:
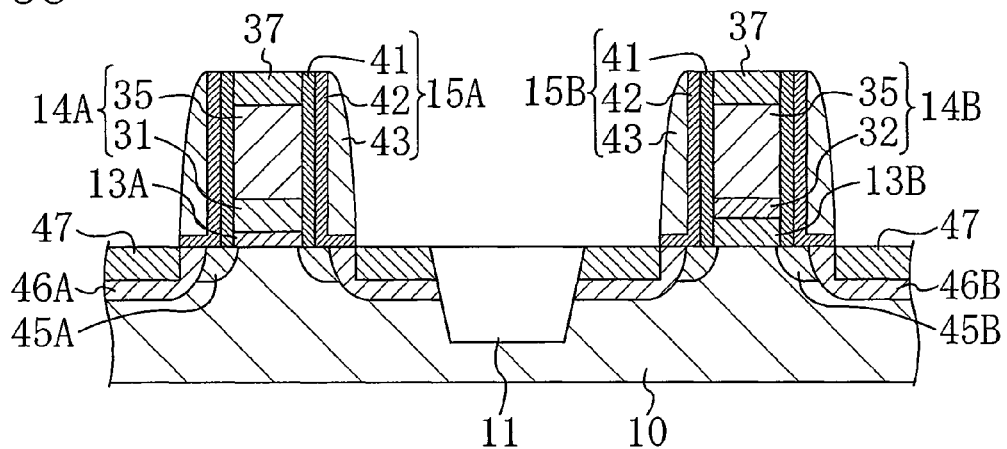
Figure 4A:
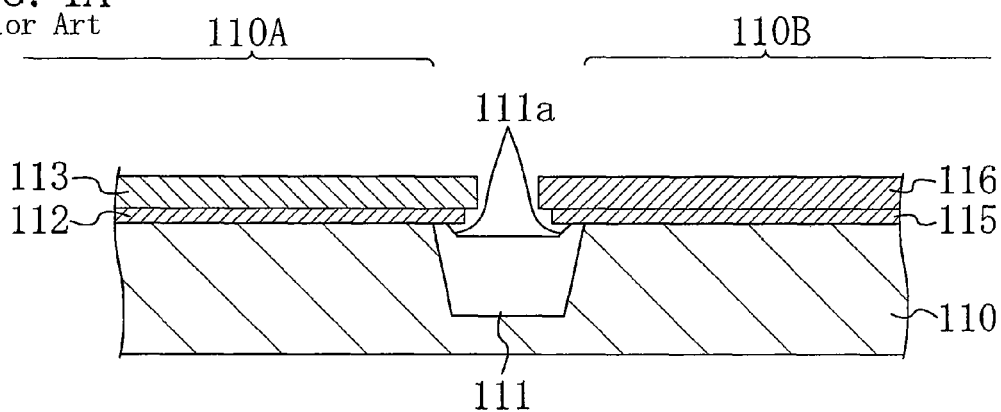
FIGS. 4A to 4C are cross-sectional views showing problems in a method for fabricating a conventional semiconductor device.
Figure 4B:
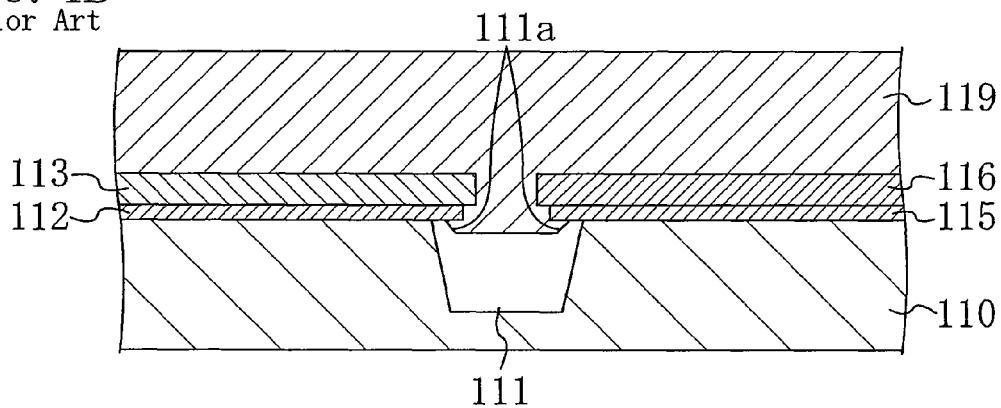
Figure 4C:
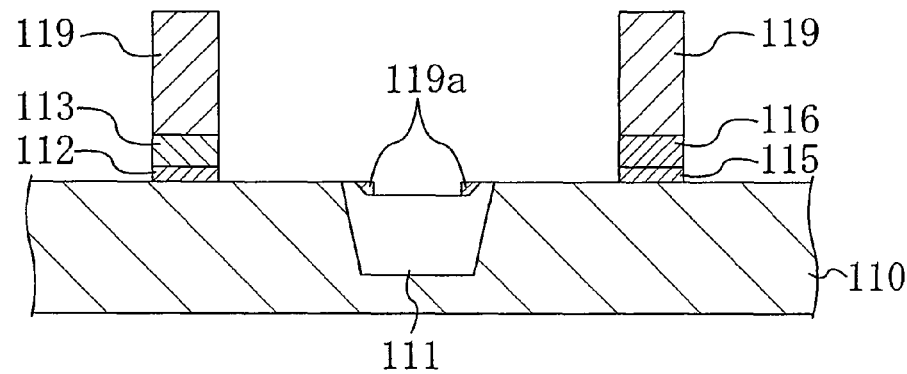

Next, as illustrated with FIG. 3C, using a known technique, first sidewalls 15A and second sidewalls 15B each having an offset spacer 41, an inner sidewall 42, and an outer sidewall 43, p-type first extension regions 45A and n-type second extension regions 45B, and p-type first source/drain regions 46A and n-type second source/drain regions 46B are formed. Subsequently, in upper portions of the first gate electrode 14A and the second gate electrode 14B and in upper portions of the first source/drain regions 46A and the second source/drain regions 46B, a silicide layer 37 and a silicide layer 47 made of nickel silicide or the like are respectively formed.

In this way, a semiconductor device including a first FET serving as a p-type MISFET and a second FET serving as an n-type MISFET are obtained.

Moreover, through a thermal processing step for activating impurities, a thermal processing step for silicidation, and the like, the first material film 21 and the second material film 22 are mixed by thermal diffusion in the second gate insulating film 13B. Therefore, the second gate insulating film 13B is a mixed film of HfSiON and La$_2$O$_3$. In the mixed film, the concentration of La usually has a higher concentration gradient in an upper portion than in a lower portion.

According to the method for fabricating the semiconductor device of the present embodiment, as illustrated with FIG. 2D, at the time of selectively removing the second conductive film 32 and the second material film 22, the first material film 21 remains on the device isolation region 11 formed in an interface between the first region 10A and the second region 10B. Therefore, the device isolation region 11 is not etched. Therefore, there is no possibility that residues of the polysilicon film 35 which are to be a cause of a defect in the semiconductor device are formed. As a result, it becomes possible to fabricate a CMISFET including a p-type MISFET and an n-type MISFET each having an optimal gate insulating film and an optimal gate electrode with good yields and stability.

Moreover, after the first conductive film 31 over the second region 10B is selectively removed, the second material film 22 is formed. Therefore, even if a reduction in thickness of the first material film 21 and damage to the first material film 21 occur at the time of selectively removing the first conductive film 31 over the second region 10B, the second material film 22 can cancel effects of the reduction in thickness and the damage. Therefore, it is possible to form a gate insulating film having high reliability without increasing the electric equivalent oxide thickness.

It is to be noted that the second gate insulating film 13B is explained as a mixed film of HfSiON and La$_2$O$_3$, but the first material film 21 and the second material film 22 may not be mixed completely, and thus an interface therebetween may remain depending on conditions of the thermal processing. Even in this case, it is possible to obtain the effect of reducing the effective work function of the second gate electrode 14B, and no problem is found. Moreover, the thermal processing step of mixing the first material film 21 and the second material film 22 may be provided independently.

An example in which a HfSiON film is used as the first material film 21 is shown, but any film may be used as long as it is a high dielectric constant insulating film. For example, an insulating film made of an oxide of a metal such as hafnium (Hf), zirconium (Zr), or yttrium (Y), oxynitride, silicate, or silicate containing nitrogen, or the like may be used.

Any film may be used as the second material film 22, but it is preferable that the second material film 22 is a film different in dielectric constant from the first material film 21. In this way, combining the second material film 22 with the first material film 21 can reduce the effective work function of the second gate electrode 14B. Moreover, making the second material film 22 of a material which can be removed selectively when the second material film 22 is formed on the first material film 21 can simplify fabrication steps. Specifically, an insulating film made of an oxide of lanthanum (La), scandium (Sc), erbium (Er), or strontium (Sr), oxynitride, silicate, or silicate containing nitrogen, or the like may be used. Moreover, it is not necessary that the second material film 22 is necessarily an insulating film. As long as the second material film 22 exhibits insulation characteristics in a state of mixed film with the first material film 21, the second material film 22 may be a metal of elementary substance.

The first gate electrode 14A is a multilayer film including the first conductive film 31 made of TiN and the polysilicon film 35, but the first conductive film 31 may be made of ruthenium (Ru), molybdenum aluminum nitride (MoAlN), or the like instead of TiN. The second gate electrode 14B is a multilayer film including the second conductive film 32 made of TaN and the polysilicon film 35, but the second conductive film 32 may be made of tantalum carbide (TaC), or the like instead of TaN. Here, the second conductive film 32 of the second gate electrode 14B of the n-type MISFET may be made of a material smaller in work function than the first conductive film 31 of the first gate electrode 14A of the p-type MISFET.

Alternatively, the first gate electrode 14A and the second gate electrode 14B may be made of the same material. For example, the effective work function of a TiN film varies according to its thickness, and as the thickness decreases, the effective work function is reduced. Therefore, making both the first conductive film 31 and the second conductive film 32 of TiN and forming the second conductive film 32 to be smaller in thickness than the first conductive film 31 can reduce the effective work function of the second gate electrode 14B of the n-type MISFET.

In the present embodiment, an example is shown in which the effective work function of the gate electrode of the n-type MISFET is reduced, but a configuration may be possible in which on the contrary, the effective work function of the gate electrode of the p-type MISFET is increased. In this case, for example, the first FET formed in the first region 10A is an n-type MISFET, the second FET formed in the second region 10B is a p-type MISFET, and the second material film may be made of a material increasing the effective work function of the second gate electrode when mixed with the first material film. For example, the first material film 21 is made of HfSiON, and the second material film is made of aluminum oxide (Al$_2$O$_3$). As a result, the second gate insulating film 13B of the p-type MISFET is made of a mixed film of HfSiON and Al$_2$O$_3$, the mixed film having a higher Al concentration in its upper portion than in its lower portion, and the first gate insulating film 13A of the n-type MISFET is made of HfSiON. With the second gate insulating film 13B, a multilayer film including the second conductive film 32 made of TiN, Ru, or MoAlN and the polysilicon film 35 may be combined as the second gate electrode 14B of the p-type MISFET, and with the first gate insulating film 13A, a multilayer film including the first conductive film 31 made of TaN or TaC and the polysilicon film 35 may be combined as the first gate electrode 14A of the n-type MISFET. Here, the second conductive film 32 of the second gate electrode 14B of the p-type MISFET is made of a material greater in work function than the first conductive film 31 of the first gate electrode 14A of the n-type MISFET.

For the first gate insulating film and first gate electrode and the second gate insulating film and second gate electrode, materials, thicknesses, and the like may be selected in such a combination that that the effective work function of the p-type MISFET is equal to or greater than 4.85 and the effective work function of the n-type MISFET is equal to or smaller than 4.25. In this way, it is possible to optimize both the p-type MISFET and the n-type MISFET.

In the present embodiment, the descriptions are given with reference to the configuration in which each of the first sidewall 15A and the second sidewall 15B includes the offset spacer 41, the inner sidewall 42, and the outer sidewall 43.

However, the offset spacer 41 is not necessarily required, and instead of a multilayer film including the inner sidewall 42 and the outer sidewall 43, a sidewall made of a single layer film may be used.

As described above, a semiconductor device and a method for manufacturing the same according to the present invention can realize a semiconductor device which includes a p-type MISFET and an n-type MISFET each having an optimal gate insulating film and an optimal gate electrode and in which no polysilicon film residue which is to be a cause of a defect is formed. The semiconductor device and the method for manufacturing the same according to the present invention are especially useful as a semiconductor device including a gate insulating film formed by a high dielectric constant film and a gate electrode formed by a metal film and as a method for fabricating the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
a first gate insulating film formed on a first region of a semiconductor substrate;
a first gate electrode formed on the first gate insulating film;
a second gate insulating film formed on a second region of the semiconductor substrate; and
a second gate electrode formed on the second gate insulating film,
wherein the first gate insulating film includes a first insulating film composed of a first material containing a first metal, and
the second gate insulating film includes a second insulating film composed of the first material and a second material containing a second metal.

2. The semiconductor device of claim 1, wherein the second insulating film has a higher concentration of the second metal in an upper portion than in a lower portion of the second insulating film.

3. The semiconductor device of claim 2, wherein the first gate insulating film is thinner than the second gate insulating film.

4. The semiconductor device of claim 2, wherein the first metal is hafnium, zirconium, or yttrium.

5. The semiconductor device of claim 2, wherein
a MISFET of first conductivity type is provided in the first region, and
a MISFET of second conductivity type is provided in the second region, and
the second metal is lanthanum, scandium, erbium, or strontium.

6. The semiconductor device of claim 2, wherein
the first gate electrode includes a first conductive film formed in contact with the first gate insulating film and a first silicon film on the first conductive film,
the second gate electrode includes a second conductive film formed in contact with the second gate insulating film and a second silicon film on the second conductive film, and
the second conductive film is made of a material which is smaller in work function than the first conductive film.

7. The semiconductor device of claim 6, wherein
the first conductive film is titanium nitride, ruthenium, or molybdenum aluminum nitride, and
the second conductive film is tantalum nitride or tantalum carbide.

8. The semiconductor device of claim 2, wherein
the first gate electrode includes a first conductive film formed in contact with the first gate insulating film and a first silicon film on the first conductive film,
the second gate electrode includes a second conductive film formed in contact with the second gate insulating film and a second silicon film on the second conductive film,
the first conductive film and the second conductive film are made of the same material, and
the first conductive film is greater in thickness than the second conductive film.

9. The semiconductor device of claim 2, wherein
an n-type MISFET is provided in the first region,
a p-type MISFET is provided in the second region, and
the second metal is aluminum.

10. The semiconductor device of claim 2, wherein
the first gate electrode includes a first conductive film formed in contact with the first gate insulating film and a first silicon film on the first conductive film,
the second gate electrode includes a second conductive film formed in contact with the second gate insulating film and a second silicon film on the second conductive film, and
the second conductive film is made of a material which is greater in work function than the first conductive film.

11. The semiconductor device of claim 10, wherein
the first conductive film is tantalum nitride or tantalum carbide, and
the second conductive film is titanium nitride, ruthenium, or molybdenum aluminum nitride.

12. The semiconductor device of claim 2, wherein
the first metal is hafnium, zirconium, or yttrium, and
the second metal is lanthanum, scandium, erbium, or strontium.

13. The semiconductor device of claim 2, wherein
the first metal is hafnium, zirconium, or yttrium, and
the second metal is aluminum.

14. The semiconductor device of claim 2, wherein
the first gate electrode includes a first conductive film formed in contact with the first gate insulating film,
the second gate electrode includes a second conductive film formed in contact with the second gate insulating film, and
the first conductive film and the second conductive film are made of the same material.

15. The semiconductor device of claim 2, wherein
the first gate electrode includes a first conductive film formed in contact with the first gate insulating film,
the second gate electrode includes a second conductive film formed in contact with the second gate insulating film, and
the first conductive film and the second conductive film are made of different materials.

16. The semiconductor device of claim 2, wherein
a p-type MISFET is provided in the first region,
an n-type MISFET is provided in the second region,
the first gate electrode includes a first conductive film formed in contact with the first gate insulating film,
the second gate electrode includes a second conductive film formed in contact with the second gate insulating film, and the second conductive film is made of a material which is smaller in work function than the first conductive film.

17. The semiconductor device of claim 2, wherein
an n-type MISFET is provided in the first region,
a p-type MISFET is provided in the second region,
the first gate electrode includes a first conductive film formed in contact with the first gate insulating film,
the second gate electrode includes a second conductive film formed in contact with the second gate insulating film, and
the second conductive film is made of a material which is greater in work function than the first conductive film.

18. The semiconductor device of claim 1, wherein the first gate insulating film is thinner than the second gate insulating film.

19. The semiconductor device of claim 1, wherein the first material is different in dielectric constant from the second material.

20. The semiconductor device of claim 1, wherein the first metal is hafnium, zirconium, or yttrium.

21. The semiconductor device of claim 1, wherein
a MISFET of first conductivity type is provided in the first region, and
a MISFET of second conductivity type is provided in the second region.

22. The semiconductor device of claim 1, wherein
a p-type MISFET is provided in the first region,
an n-type MISFET is provided in the second region, and
the second metal is lanthanum, scandium, erbium, or strontium.

23. The semiconductor device of claim 1, wherein
a p-type MISFET is provided in the first region,
an n-type MISFET is provided in the second region,
the first material is hafnium silicate nitride, and
the second material is lanthanum oxide.

24. The semiconductor device of claim 1, wherein
the first gate electrode includes a first conductive film formed in contact with the first gate insulating film and a first silicon film on the first conductive film,
the second gate electrode includes a second conductive film formed in contact with the second gate insulating film and a second silicon film on the second conductive film, and
the second conductive film is made of a material which is smaller in work function than the first conductive film.

25. The semiconductor device of claim 24, wherein
the first conductive film is titanium nitride, ruthenium, or molybdenum aluminum nitride, and
the second conductive film is tantalum nitride or tantalum carbide.

26. The semiconductor device of claim 1, wherein
the first gate electrode includes a first conductive film formed in contact with the first gate insulating film and a first silicon film on the first conductive film,
the second gate electrode includes a second conductive film formed in contact with the second gate insulating film and a second silicon film on the second conductive film,
the first conductive film and the second conductive film are made of the same material, and
the first conductive film is greater in thickness than the second conductive film.

27. The semiconductor device of claim 1, wherein
an n-type MISFET is provided in the first region,
a p-type MISFET is provided in the second region, and
the second metal is aluminum.

28. The semiconductor device of claim 1, wherein
an n-type MISFET is provided in the first region,
a p-type MISFET is provided in the second region,
the first material is hafnium silicate nitride, and
the second material is aluminum oxide.

29. The semiconductor device of claim 1, wherein
the first gate electrode includes a first conductive film formed in contact with the first gate insulating film and a first silicon film on the first conductive film,
the second gate electrode includes a second conductive film formed in contact with the second gate insulating film and a second silicon film on the second conductive film, and
the second conductive film is made of a material which is greater in work function than the first conductive film.

30. A semiconductor device of claim 29, wherein
the first conductive film is tantalum nitride or tantalum carbide, and
the second conductive film is titanium nitride, ruthenium, or molybdenum aluminum nitride.

31. The semiconductor device of claim 1, wherein
the first gate insulating film includes a first interface layer under the first insulating film, and
the second gate insulating film includes a second interface layer under the second insulating film.

32. The semiconductor device of claim 1, further comprising:
a first silicide layer on the first gate electrode; and
a second silicide layer on the second gate electrode.

33. The semiconductor device of claim 1, wherein
the first metal is hafnium, zirconium, or yttrium, and
the second metal is lanthanum, scandium, erbium, or strontium.

34. The semiconductor device of claim 33, wherein
a p-type MISFET is provided in the first region,
an n-type MISFET is provided in the second region,
the first gate electrode includes a first conductive film formed in contact with the first gate insulating film,
the second gate electrode includes a second conductive film formed in contact with the second gate insulating film, and
the second conductive film is made of a material which is smaller in work function than the first conductive film.

35. The semiconductor device of claim 1, wherein
the first metal is hafnium, zirconium, or yttrium, and
the second metal is aluminum.

36. The semiconductor device of claim 35, wherein
an n-type MISFET is provided in the first region,
a p-type MISFET is provided in the second region,
the first gate electrode includes a first conductive film formed in contact with the first gate insulating film,
the second gate electrode includes a second conductive film formed in contact with the second gate insulating film, and
the second conductive film is made of a material which is greater in work function than the first conductive film.

37. The semiconductor device of claim 1, wherein
the first gate electrode includes a first conductive film formed in contact with the first gate insulating film,
the second gate electrode includes a second conductive film formed in contact with the second gate insulating film, and
the first conductive film and the second conductive film are made of the same material.

38. The semiconductor device of claim 1, wherein
the first gate electrode includes a first conductive film formed in contact with the first gate insulating film, the second gate electrode includes a second conductive film formed in contact with the second gate insulating film, and the first conductive film and the second conductive film are made of different materials.

39. The semiconductor device of claim 1, wherein a p-type MISFET is provided in the first region, an n-type MISFET is provided in the second region, the first gate electrode includes a first conductive film formed in contact with the first gate insulating film, the second gate electrode includes a second conductive film formed in contact with the second gate insulating film, and the second conductive film is made of a material which is smaller in work function than the first conductive film.

40. The semiconductor device of claim 1, wherein an n-type MISFET is provided in the first region, a p-type MISFET is provided in the second region, the first gate electrode includes a first conductive film formed in contact with the first gate insulating film, the second gate electrode includes a second conductive film formed in contact with the second gate insulating film, and the second conductive film is made of a material which is greater in work function than the first conductive film.

41. The semiconductor device of claim 1, wherein the first insulating film does not contain the second metal.

42. The semiconductor device of claim 1, further comprising:

a first extension region of first conductivity type formed extending laterally from the first gate electrode in the first region such that the first extension region overlaps with an edge of the first electrode from an underside of the first gate electrode; and a second extension region of second conductivity type formed extending laterally from the second gate electrode in the second region such that the second extension region overlaps with an edge of the second gate electrode from an underside of the second gate electrode.

43. The semiconductor device of claim 1, further comprising:

a first sidewall which is formed over a side face of the first gate electrode and includes an L-shaped first inner sidewall and a first outer sidewall on the first inner sidewall; and a second sidewall which is formed over a side face of the second gate electrode and includes an L-shaped second inner sidewall and a second outer sidewall on the second inner sidewall.

44. The semiconductor device of claim 43, wherein the first sidewall is formed on an I-shaped first offset spacer on the side face of the first gate electrode, and the second sidewall is formed on an I-shaped second offset spacer on the side face of the second gate electrode.

45. The semiconductor device of claim 1, wherein a p-type MISFET is provided in one of the first region and the second region and an n-type MISFET is provided in the other of the first region and the second region, the p-type MISFET has an effective work function of 4.85 or larger, and the n-type MISFET has an effective work function of 4.25 or smaller.

\* \* \* \* \*